United States Patent [19]

Craycraft et al.

[11] Patent Number: 4,636,664

[45] Date of Patent: Jan. 13, 1987

[54] CURRENT SINKING RESPONSIVE MOS SENSE AMPLIFIER

[75] Inventors: Donald G. Craycraft, Spring Valley; Giao N. Pham, Centerville, both of Ohio

[73] Assignee: NCR Corporation, Dayton, Ohio

[21] Appl. No.: 705,298

[22] Filed: Feb. 25, 1985

Related U.S. Application Data

[62] Division of Ser. No. 456,938, Jan. 10, 1983.

[51] Int. Cl.$^4$ .......................... H03K 5/24; G11C 7/06
[52] U.S. Cl. .................................... 307/530; 307/362; 365/203; 365/208; 365/104
[58] Field of Search ...................... 307/530, 355, 362; 365/103, 104, 203, 205, 207, 208

[56] References Cited

U.S. PATENT DOCUMENTS

| | | | |
|---|---|---|---|
| 3,882,326 | 5/1975 | Kruggel | 307/530 |
| 3,938,108 | 2/1976 | Salsbury | 365/104 |
| 4,181,865 | 1/1980 | Kohyama | 307/530 |
| 4,223,394 | 9/1980 | Pathak et al. | 365/207 X |
| 4,445,203 | 4/1984 | Iwahashi | 365/205 X |

FOREIGN PATENT DOCUMENTS 2089612 6/1982 United Kingdom ................ 307/530

*Primary Examiner*—Larry N. Anagnos
*Attorney, Agent, or Firm*—Wilbert Hawk, Jr.; Casimer K. Salys

[57] ABSTRACT

A sense amplifier for a read only memory array which is formed from a multiplicity of NAND organized FET stacks. The sense amplifier compares the current sinking capacity of a selected bit line stack with that of a reference stackline, the difference being detected as a voltage shift in a differential stage. Pass FETs with gate electrodes biased in inverse proportion to the bit and reference line potentials are serially connected between the corresponding lines and reference nodes.

3 Claims, 15 Drawing Figures

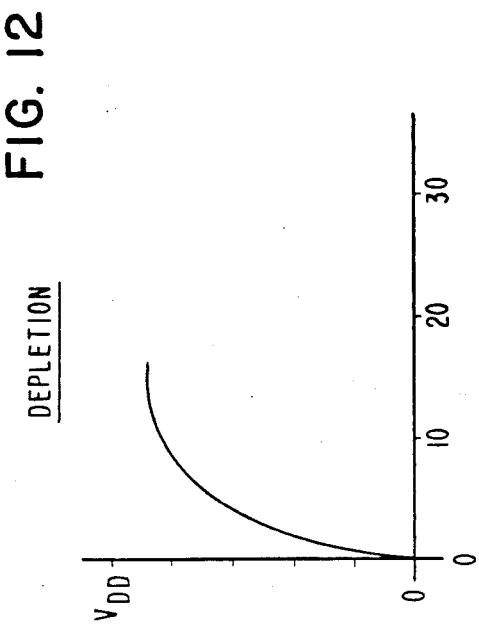
FIG. 12 DEPLETION
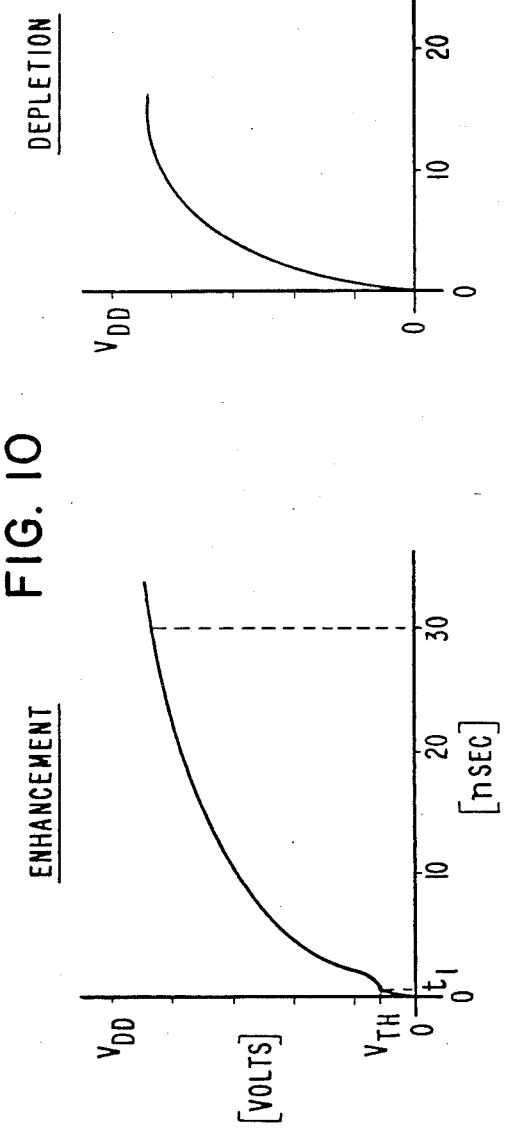
FIG. 10 ENHANCEMENT
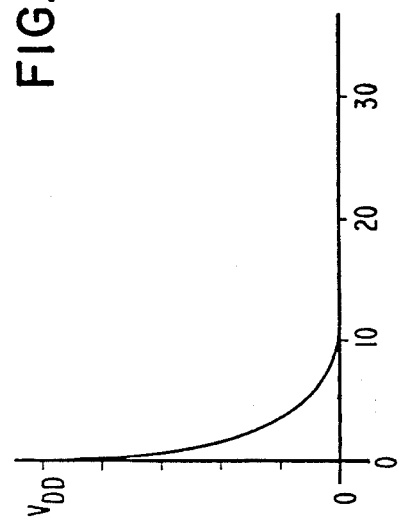
FIG. 13
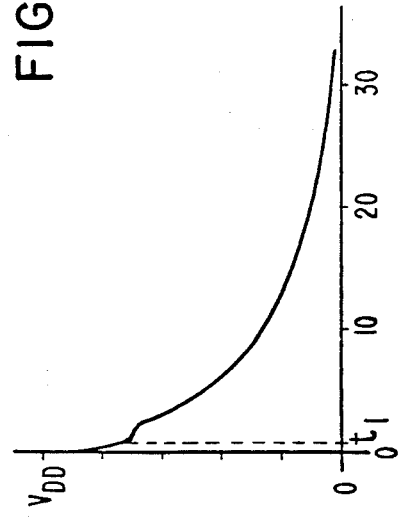
FIG. 11

CURRENT SINKING RESPONSIVE MOS SENSE AMPLIFIER

This application is a division of application Ser. No. 456,938, filed Jan. 10, 1983.

FIELD OF THE INVENTION

This invention relates to high density, digital read-only memory (ROM) systems implemented with field effect transistors on semiconductor chips.

BACKGROUND OF THE INVENTION

Among the advances sought by designers of read-only memories are features which increase the data storage density while reducing or at least maintaining the access time. In attempting to obtain such objectives, contemporary designers of ROMs, utilizing silicon gate field effect transistors (FETs) programmed by the selective formation of depletion or enhancement devices, have digressed from the common NOR/OR logic arrangements toward the higher densities inherent with NAND/AND logic arrangements. The distinctions and considerations which result in the trend are aptly described in U.S. Pat. No. 4,142,176, the subject matter of which is hereby incorporated by reference.

FIGS. 1 and 2 illustrate the general state of the present technology as it relates to NAND configurations of FETs to form ROM arrays. In the rudimentary NAND ROM, 1, illustrated in FIG. 1, lines designated ROW 0 to ROW n are selectively energized with binary "0" or "1" level voltages, 0 and 5 volts respectively, while BIT LINES 0 to m are selectively monitored for a ground path as the response. If, as shown in FIG. 1, FET 2 is fabricated to be a depletion type device, the output on BIT LINE m−1 is the same whether the voltage on the line of ROW 3 is a "0" or a "1". The efficiency with which such a configuration utilizes available chip area is also described in the aforementioned U.S. Patent.

Notwithstanding the improved density obtained with the configuration represented by the NAND ROM 1, its usage is relatively limited by virtue of the slow access speed. In comparison, the access speed is significantly worse than that of a classic NOR configured ROM. The slow speed is primarily a result of the longer path length, and associated increase in the path impedance.

In an attempt to balance the design characteristics optimizing density and those favoring access time, it has been proposed that the logic arrangement of the ROM take the NAND ROM WITH BANK (stack) SELECT configuration shown at 3 in FIG. 2. With this configuration additional bit lines, such as 4, divide the n row array into two banks to reduce the length of the series path through the NAND FETs by approximately one-half. In exchange, the ROM sacrifices the chip area consumed by the additional bit lines; additional bank select addressing FETs, such as FETs 6 and 7; and additional connections 8 to join line 4 with the electrode corresponding to node 9. Common practice prescribes that node 9 actually constitute a single source/drain (S/D) diffusion, common to FETs 6 and 7, that line 8 be a via through a dielectric layer, and that line 4 be a second conductive (metal) layer physically situated substantially overlying the corresponding columns of FETs. The first conductive layer in such an integrated circuit configuration is typically patterned from the polycrystalline silicon (poly) to form the FET gate electrodes corresponding to the row and bank select lines.

Unfortunately, NAND ROM WITH BANK SELECT 3 requires a significant sacrifice in chip density to decrease the access time. To understand the relative implications of density, contrast the logic arrangements in FIGS. 1 and 2 in terms of integrated circuit structure. Given that the number of rows is relatively large, the loss in chip area due to nodes 9, connecting lines 8, and bank select FETs 6 and 7, in progressing from the single NAND ROM in FIG. 1 to the NAND ROM WITH BANK SELECT in FIG. 2, is minimal. To some extent this result is attributable to the continuity of the small pitch (spacing from center-line to center-line) between the row-oriented poly gate lines. The columns in the configuration of FIG. 2 are, however, significantly affected by the structural rearrangement. Though the pitch between successive diffusions defining the columns of FETs remains unaltered, the larger pitch of the bit lines now imposes a lower limit on the spacing between successive columns. For example, if the active area pitch, i.e., the pitch of the diffusion forming the successive bit lines m−1, m of the NAND ROM configuration in FIG. 1, were nominally 4 microns, and the nominal pitch of the metal bit lines 4 in the NAND ROM WITH BANK SELECT of FIG. 2 were 8 microns, the metal bit lines would constrain the ROM density to approximately one-half that available with the configuration in FIG. 1.

BRIEF SUMMARY OF THE INVENTION

The present invention as embodied herein provides the logic and structure arrangement to create an integrated circuit ROM of reduced size by insuring that ROM density is not constrained by the pitch of the metal bit lines. Furthermore, the featured configuration limits the number of FETs in each NAND stack to maintain acceptable access time. Still further benefits include circuit features which provide for the unloading of unaddressed bit lines through virtual ground isolation, the configuration of the column selections in an OR logic arrangement, the selective precharging of bit lines, current responsive sense amps, reference cell comparison of data signals, and drive circuits with mask programmable adjustments in the rate of rise and fall of the output signal.

In the presently preferred embodiment, the ROM array is configured in an X-AND-OR arrangement consisting of NAND FET stacks, in addressably interleaved groups of four, and intersecting orthogonally projecting bank and row lines. At one end, four adjacent stacks in the array are connected to a common bit line. At the opposite end of the four stacks, a pair of adjacent stacks is connected to a virtual ground line further common with a pair of stacks from an adjacent set of four NAND stacks. Selection between pairs of stacks is performed with NAND arranged bank select FETs.

The composite ROM system is columnar in general structure, with each column segment joined by a common set of eight bit lines. The bit lines are connected to multiple NAND stacks, which are individually selected according to a row, bank and column select address. To reduce access time, the bit lines and virtual ground lines in each columnar segment of the composite ROM system are precharged by individually synchronized bias circuits which are referenced to a master precharge drive circuit.

The data content of the ROM is selected by the concurrence of a row-bank-column/ground address. Each selected NAND stack is coupled via the selected bit line to a unique sense amp circuit. In one form, the sense amp circuit includes two current responsive amplifiers and a differential amplifier. One current responsive amplifier is connected to the bit line while the other is connected to a reference cell. Constant current sources are coupled to the bit line and the reference cell to detect a change in the potential on the bit line from the precharge level. Discharge of the bit line by the formation of a NAND stack path to ground, draws current from the constant current source to offset the node voltage coupled to the differential amplifier.

The composite of the present ROM system also includes a unique variable speed drive circuit, suitably configured to adjust the rate of rise and fall of the binary format output signal. Adjustability in the parameter permits matching with succeeding data responsive circuits. In one form, the variable speed driver includes a pair of FETs which are programmed as either depletion or enhancement type devices at the time the ROM is programmed by the fabrication mask.

These and numerous other features of the invention will be fully recognized upon considering the particular embodiment disclosed in the ensuing detailed description.

BRIEF DESCRIPTION OF THE DRAWINGS

FIGS. 10-13 depict plots of programmed rise and fall rates for the variable speed driver circuit.

DETAILED DESCRIPTION OF THE INVENTION

Figure 1:
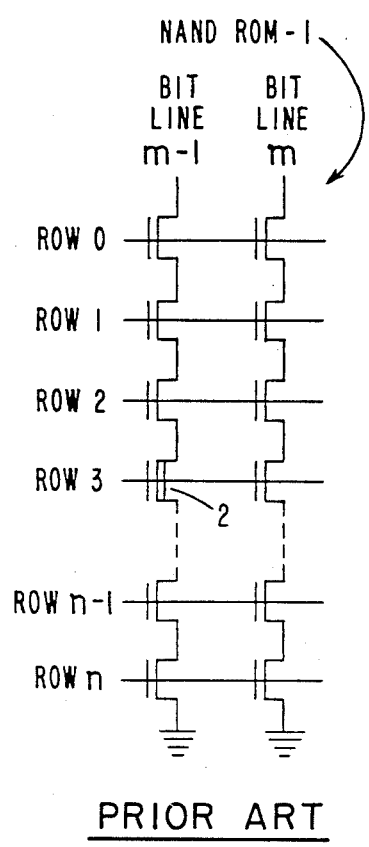
FIGS. 1 and 2 are schematic depictions of prior art NAND arranged ROM FETs, respectively configured without and with the bank select feature.

The presently preferred embodiment of the invention disclosed hereinafter is presented in the context of a composite ROM system, generally shown at reference numeral 11 in FIG. 3 of the drawings. The exemplary ROM is configured to include the memory content of 65,536 data bits, individually accessed by 13 address lines. The output is comprised of 8 bit data words which appear on an 8 line bus.

The ROM is physically implemented on an integrated circuit (IC) chip using n-channel silicon designed around a power supply voltage $V_{DD}$ of approximately 5 volts. ROM data is programmed by ion implantation at the masking level used to establish FET operating modes as being either depletion or enhancement types. The preferred physical arrangement further utilizes polycrystalline silicon materials for the row conductors, which constitute the gate electrodes of the row and bank select FETs. The bit and virtual ground line conductors are preferably metal. Dimensionally, the nominal pitch for the active areas, the S/D diffusions, is 4 microns, while the metal conductor pitch is a nominal 8 microns.

Figure 2:
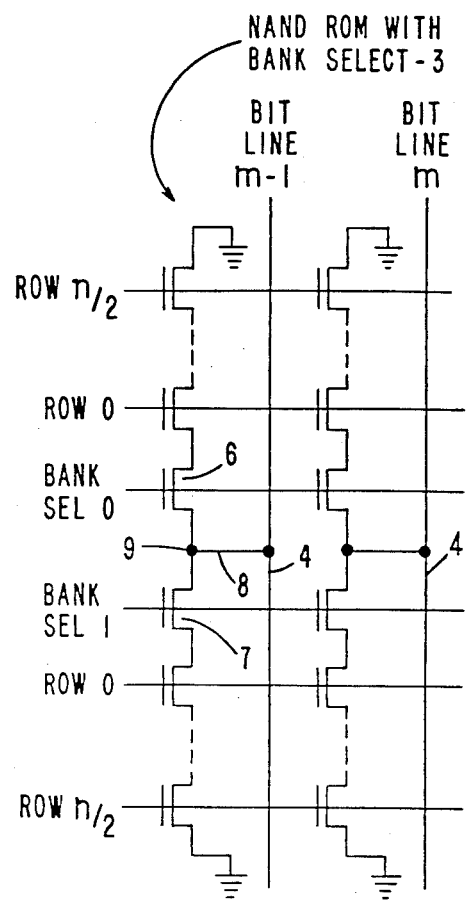

To understand the various circuits depicted in the drawings, it should be understood that symbols of the form used to depict FET 2 in FIG. 1 represent depletion type devices, while the enhancement type FET is represented by the symbol corresponding to depicted FETs 6 or 7 in FIG. 2. The threshold voltages of the enhancement and depletion FETs are approximately 0.6 volts and $-3.0$ volts, respectively.

Figure 3:
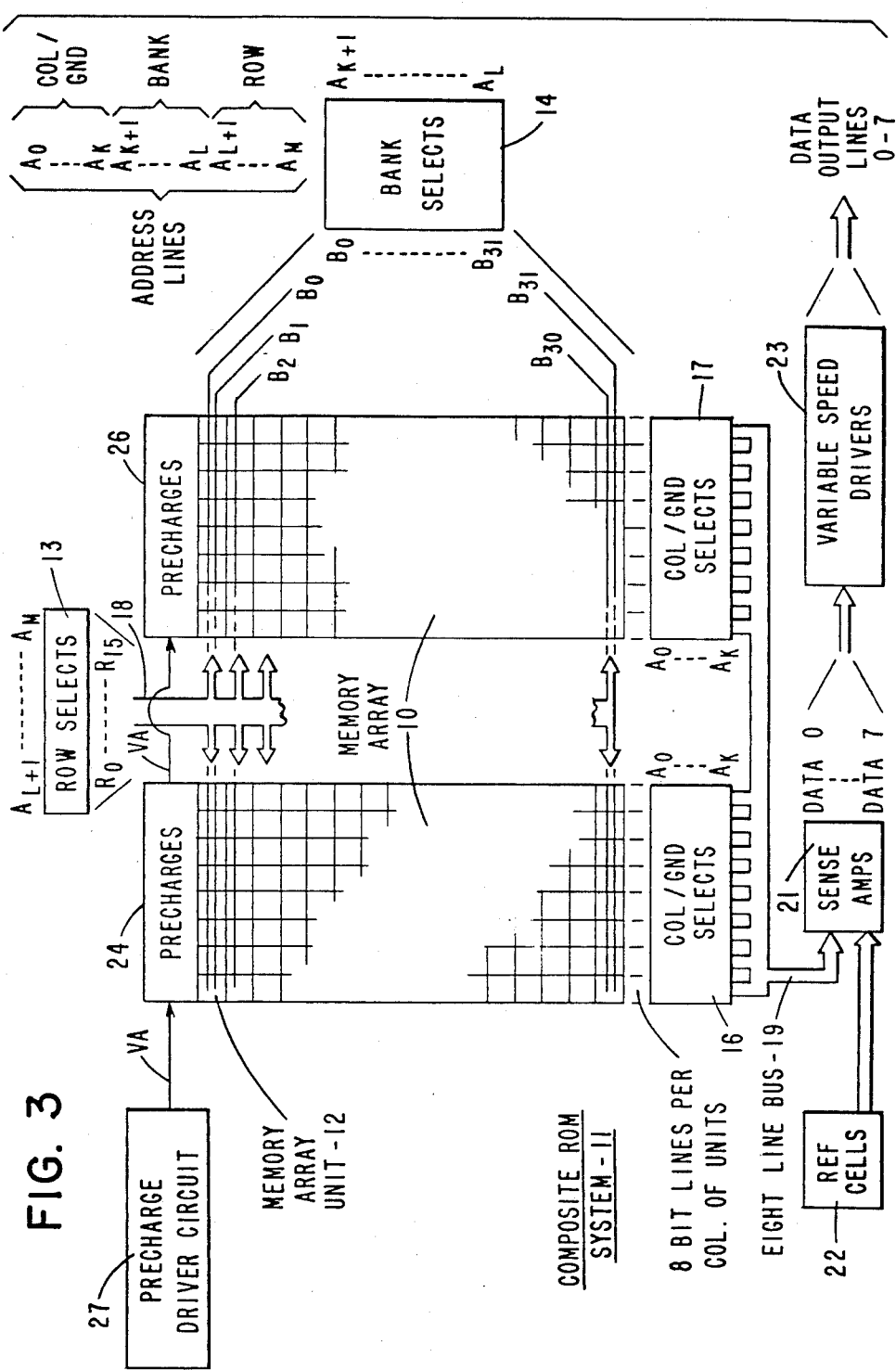
FIG. 3 is a schematic block diagram of a preferred composite ROM system.

To understand and appreciate some of the features which make the X-AND-OR array unique, consider the operation of the array according to the presently preferred arrangement depicted in FIG. 3. ROM address lines $A_O-A_M$ are shown to consist of three portions; (1) lines $A_O-A_K$ for addressing the column/ground (col/gnd) lines, (2) lines $A_{K+1}-_L$ for addressing bank lines, and (3) lines $A_{L+1}-A_M$ for addressing the ROM row lines.

The presently preferred composite ROM system is formed from a multiplicity of individually addressable cells, which cells are themselves formed by a FET which has been selectively programmed during fabrication to operate in either an enhancement or a depletion mode. See ROM cell FET 32 in FIG. 4. At the next level of combination, such FETs are organized into multiple NAND stacks with unique interconnect arrangements to form a single memory array unit, 12. According to composite ROM system 11 shown in FIG. 3, memory array units 12 are then further grouped into 16 banks (appearing structurally as rows) of 16 columns. With this configuration, the 8 bit lines in any column can be connected to the 8 lines of bus 19 by the action of column/ground selects 16 and 17.

Conventional decoder 13 converts address bits appearing on lines $A_{L+1}-A_M$ to signals on row select lines $R_O-R_{15}$. All 16 row select lines project from centrally disposed row bus 18 through each unit 12 in each bank of memory array 10.

Units within each bank of memory array 10 are further selected by a pair of bank select lines, e.g. $B_0$ and $B_1$, which project in pairs across each bank of memory array 10 from bank selects block 14. Selection among the lines $B_0-B_{31}$ is based on the signals presented on address lines $A_{K+1}-A_L$.

The column and virtual ground selection is performed in column/ground selects blocks 16 and 17. In making a column/ground selection, the 8 bit lines in one of the 16 distinct columns of units in memory array 10 is coupled to 8 line bus 19. The signals on address lines $A_O-A_K$ determine the selection.

A further novel aspect of the invention as embodied resides in the use of 8 current responsive sense amps, shown in block 21, to detect the data content represented by the state of each bit line coupled to bus 19. Each sense amp in block 21 compares the current sinking capacity of the corresponding bit line with that of 8 reference cells in block 22.

The binary signals at the output of sense amps 21, on lines DATA 0 to DATA 7, are subjected to power amplification with selectable rate-of-change compensation. The rate-of-change compensation is implemented with the 8 mask programmable variable speed drivers in block 23, to ensure interface compatibility with successive circuits.

The embodiment of the composite ROM system in FIG. 3 also incorporates a multiplicity of precharge circuits, arranged in two groups 24 and 26, of eight circuits each, in correspondence to the column organization of memory array 10. All 16 precharge circuits are driven according to the bias voltage established in precharge driver circuit 27. The implementation of precharge circuits 24 and 26 provides precharging for both the bit lines and virtual ground lines in memory array units 12 to a voltage substantially equal to the nominal level within each current sensing amp of block 21.

With an understanding of the relevant prior art and general structural organization of composite ROM system 11 at hand, the ensuing description will focus on the structural and functional aspects of the actual circuits which contribute singly and in combination to provide the unique features which characterize the present invention. Row selects 13 and bank selects 14 will not be described in the ensuing development because they correspond to structural arrangements commonly known in the prior art. The same is true for the decode circuits which convert signals on column address line $A_O$–$A_K$ to column select lines designated by reference symbols C.

The first element to be considered in detail is memory array unit 12 from memory array 10. The organization of unit 12 is depicted schematically in FIG. 4, within the dashed lines, with a partial operational equivalent circuit schematically depicted in FIG. 5, and a partial logic diagram schematically depicted in FIG. 6. For purposes of locational reference within the diagram of composite ROM system 11 in FIG. 3, the memory array unit in FIG. 4 would reside in the upper-left corner of memory array 10.

Figure 4:
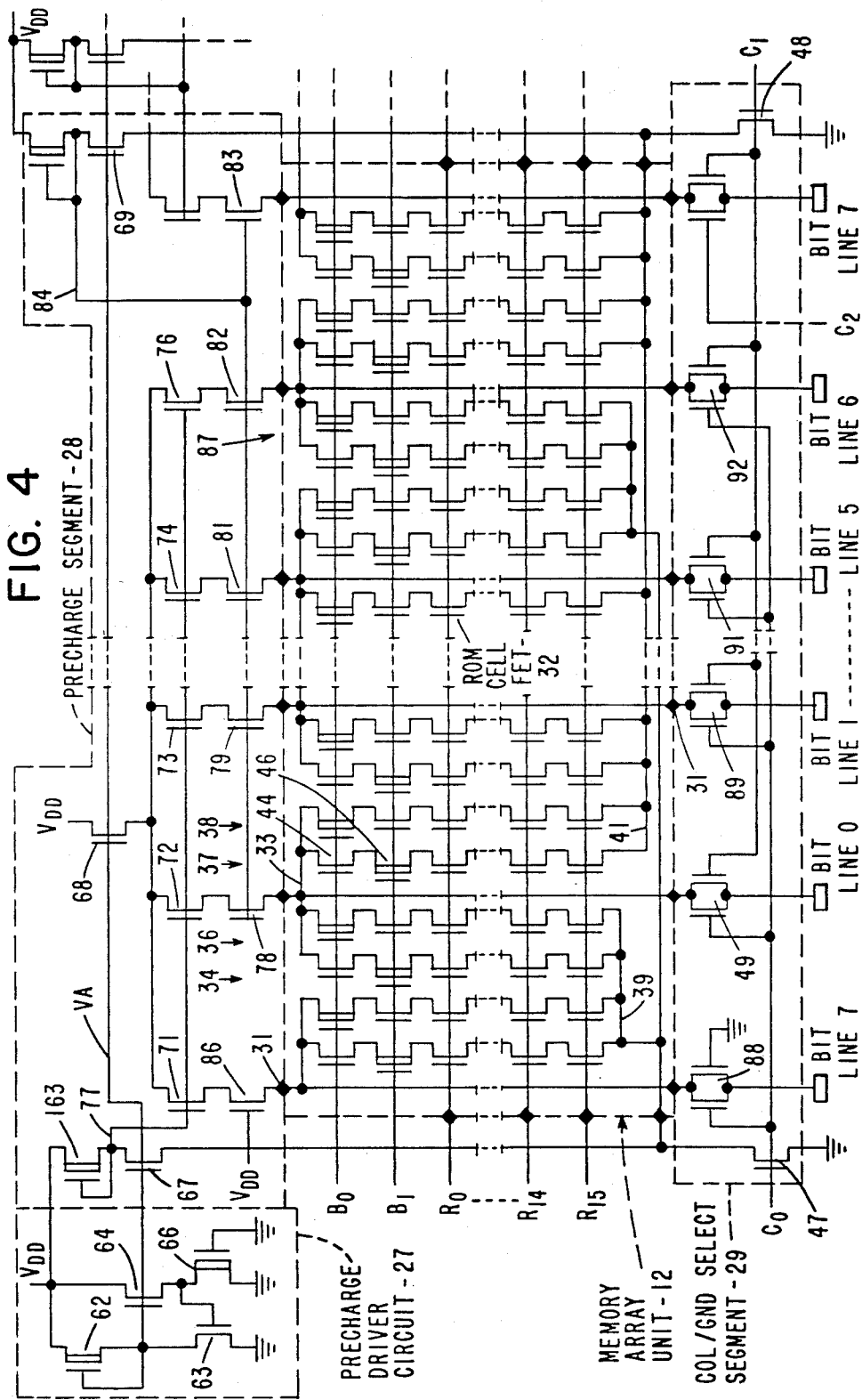
FIG. 4 is a schematic diagram including a preferred memory array unit and segments from the precharge and column/ground select circuits.

In analyzing the schematic of FIG. 4, it should be recognized that memory array unit 12 is but one of a 16×16 group forming memory array 10 (FIG. 3). Whereas the whole of precharge drive circuit 27 is shown in FIG. 4, precharge segment 28 represents only that segment of precharge 24 (FIG. 3) necessary to operate the first column of memory array 10. Column/ground select segment 29 is similarly situated, in that it too relates only to a single column of memory array 10. The output lines from column/ground select segment 29, i.e. BIT LINES 0–7, correspond to the 8 lines of bus 19 (FIG. 3) connected into sense amps 21.

Note that 8 electrical nodes are designated at the dashed line perimeter of memory array unit 12 in FIG. 4 by diamond-shaped symbols 31. These nodes are common to all units in a single column of memory array 10 (FIG. 3). The bank select lines, shown as $B_0$ and $B_1$, differ from unit to unit in any column of array 10 depending on the bank depicted. In the example of FIG. 4, the presence of $B_0$ and $B_1$ as the bank select lines establishes that depicted memory array unit 12 is from the first bank of the 16 banks in memory array 10 (FIG. 3).

As was true of the prior art shown in FIGS. 1 and 2, memory array unit 12 in FIG. 4 is composed of multiple, NAND-connected FETs. Each ROM cell FET, 32, in a NAND stack is fabricated in the manner of the prior art to be either an enhancement or depletion mode device depending on the programmed bit content.

To gain greater understanding of the X-AND-OR array of the present invention, consider the section of memory array unit 12 in FIG. 4 which is connected to bit node 33 and addressable as BIT LINE 0. The four NAND-connected FET stacks, 34, 36, 37 and 38, are joined at one end to bit node 33 and connected at their opposite ends, in distinct pairs, to virtual ground nodes 39 and 41. Note that virtual ground nodes 39 and 41 are themselves connected to pairs of adjacent NAND stacks from adjacent bit lines, and alternate in succession across memory array unit 12 by pairs.

Figure 5:
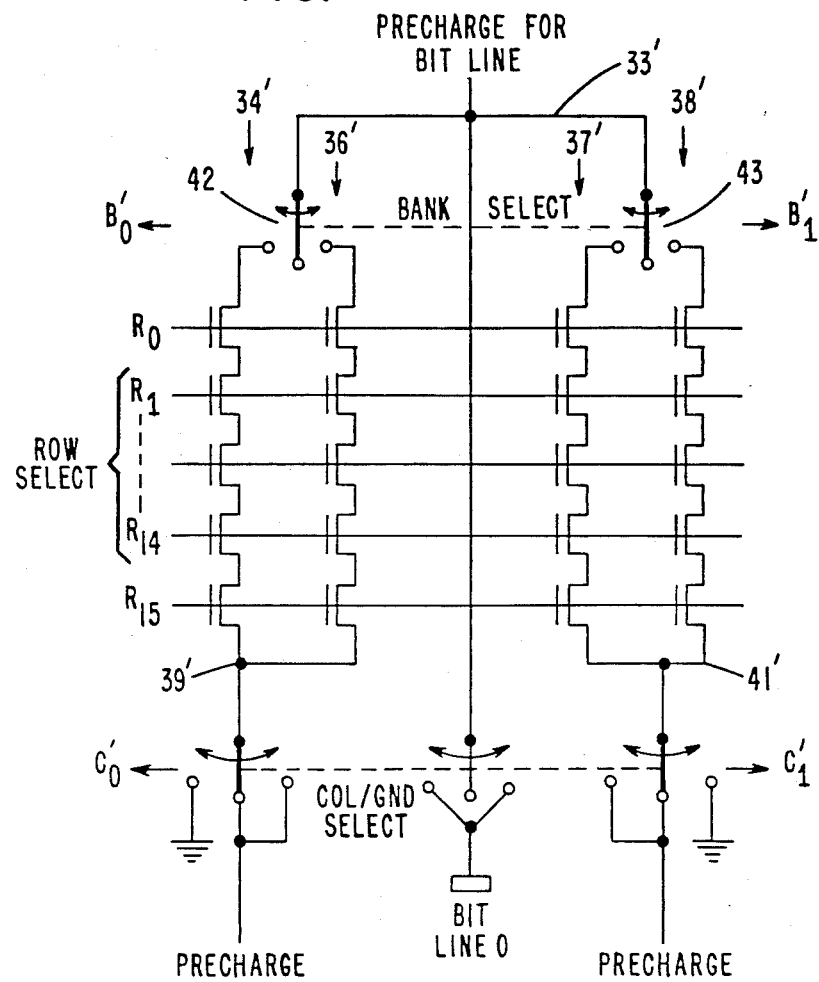
FIGS. 5 and 6 are the functional and logic diagram equivalent circuits for the schematic in FIG. 4.

To understand the operational implications of this structure in the course of selecting a particular NAND stack, and thereby addressing the ROM data therein, it may be of value to make periodic reference to the functional equivalent circuit in FIG. 5. Functional correspondence of the devices, nodes and operational signals depicted in FIG. 5 to those in FIG. 4 is shown by the addition of prime symbols to the reference numerals or letters. Referring to FIGS. 4 and 5 jointly, bank selection between pairs of NAND stacks 34 and 37, or 36 and 38, is implemented in the manner of switches 42 and 43 on the basis of signals of opposite binary state on bank select lines $B_0$ and $B_1$. In FIG. 4, the switching is accomplished by employing a structure of alternate enhancement and depletion FETs in the stacks, for example, FETs 44 and 46. With that arrangement, if the signal on line $B_0$ is a binary "1" (5 volts) and line $B_1$ is a binary "0", NAND stacks 34 and 37 are enabled, whereas stacks 36 and 38 remain disabled. A reversal of the bank select signals interchanges the selected and nonselected NAND stacks.

Further selection among the NAND stacks is performed with column line select signals of appropriate binary state on lines $C_0$ and $C_1$, to change one or the other of virtual ground nodes 39 or 41 to actual grounds and to couple the selected bit nodes to the bit lines, e.g. bit node 33 to BIT LINE 0. In this way, the bank select signals enable stacks 34 and 37, or 36 and 38, whereas the column/ground select signals enable stacks 34 and 36, or 37 and 38. By process of elimination, only one stack is actually selected.

The implementation of the column/ground select according to the structure in FIG. 4 is performed with FETs 47 and 48. For instance, if the signal on line $C_0$ is a binary "1", and $C_1$ is a binary "0", virtual ground node 39 is connected to ground while virtual ground node 41 remains floating at the precharged level. If, under those conditions, bank line $B_0$ is also at binary "1", stack 34 is selected for BIT LINE 0. Thereafter, the content of the stack and the signals on row select lines $R_0$–$R_{15}$ determine if a conductive path will be formed through NAND stack 34 to discharge bit node 33. Note that a binary "1" signal on line $C_0$ also enables column pass FET 49 to convey the state of bit node 33 to BIT LINE 0.

Figure 6:
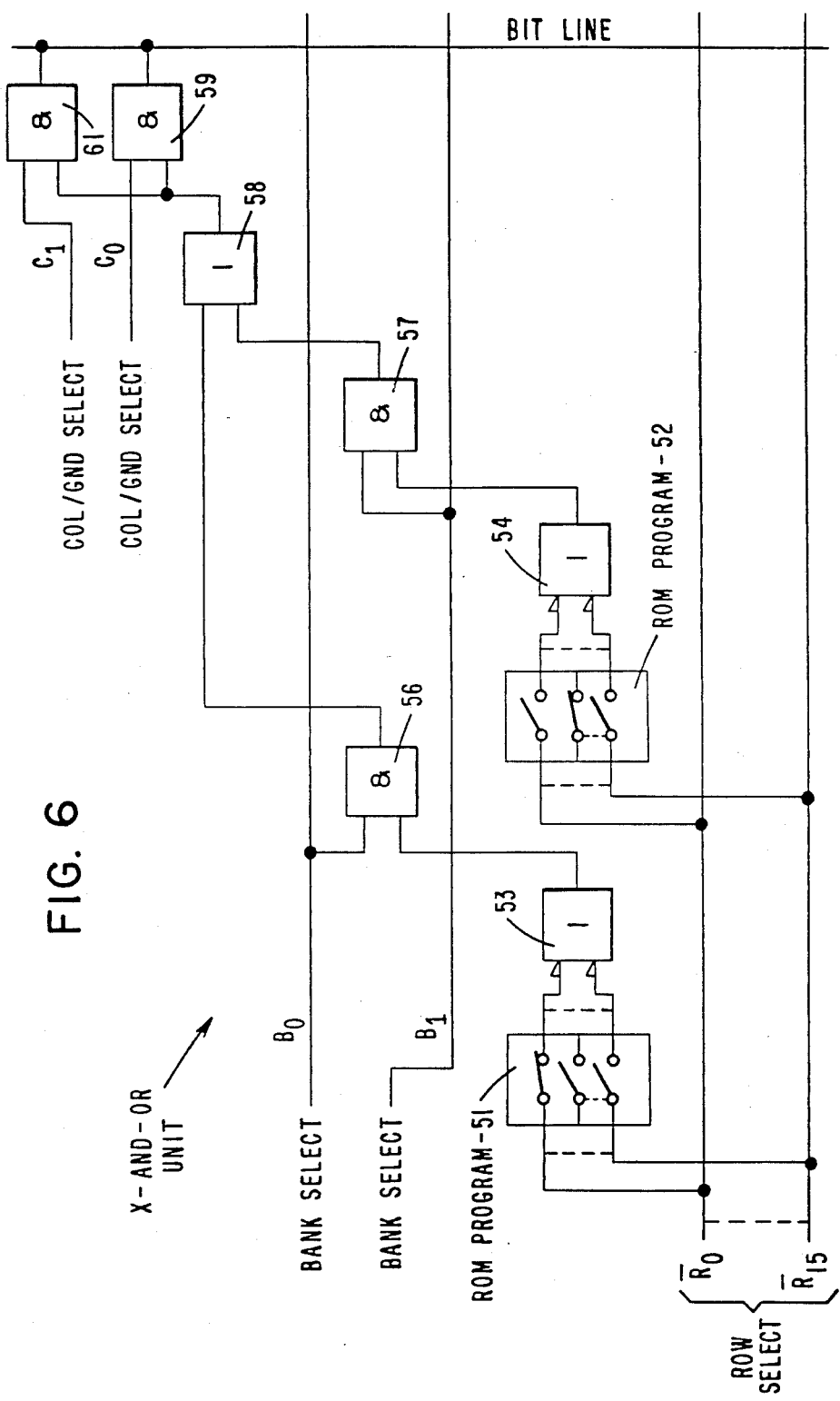

The logic diagram equivalent of the NAND stacks 34, 36, 37 and 38 together with bank and column/ground select elements is schematically depicted in FIG. 6 to illustrate the X-AND-OR concept. In terms of analogous logic operations, ROM program blocks 51 and 52 correspond to the enhancement or depletion states of the programmed ROM cell FETs, e.g. 32, in FIG. 4; NAND blocks 53 and 54 correspond to the series connection of ROM cell FETs 32; and AND blocks 56 and 57 represent the contribution of bank select FETs such as 44 and 46. These together form the AND logic. The OR logic is shown in block 58 of FIG. 6, and corresponds structurally to the common connection of NAND stacks 34, 36, 37 and 38 at bit node 33 in FIG. 4. The X logic is represented by the AND blocks 59 and 61 in FIG. 6. As implied by the X nomenclature, the selection of the NAND stacks by column/ground select lines C effectuates both a selection operation to connect the output and a transformation of a virtual ground to an actual ground.

With an understanding of the structure and operation of an X-AND-OR type memory array, attention will now be directed to the unique features present in related circuits which contribute to the formation of composite ROM system 11.

The circuit elements which form precharge driver circuit block 27, appearing in FIG. 3, are illustrated in full detail in FIG. 4. The output line from precharge driver circuit 27 is designated VA. Reference to FIG. 3 shows that line VA projects through both precharge blocks, 24 and 26, and is therefore common to all 16 precharge segments.

The schematic of precharge driver circuit 27 shown in FIG. 4 includes source-follower connected depletion FET 62 connected in series with enhancement FET 63 via a point common to line VA, to form a voltage divider at line VA. In parallel with the voltage divider is the series connection of enhancement FET 64 and depletion FET 66. Line VA is connected to the gate electrode of FET 64. The gate and source electrodes of FET 66 are grounded. The node common to the source and drain connections of respective FETs 64 and 66 is connected to the gate electrode of FET 63. FET 66 prevents the gate of FET 63 from floating.

The output from precharge driver circuit 27 on line VA is a fixed voltage, having a nominal value of 2.4 volts when $V_{DD}$ is 5 volts. When FETs 67, 68 and 69 have a nominal threshold voltage of 0.6 volts, the virtual ground nodes, such as 39 and 41, as well as the bit nodes, such as 33, are precharged to a nominal value of 1.8 volts. By choice, the 1.8 volts represents the nominal midpoint voltage between the binary extremes on the respective nodes. To ensure that nodes corresponding to 33, 39 and 41 are precharged to the correct level, the design of ROM system 11 (FIG. 3) provides that FETs 67, 68 and 69 in precharge segment 28, and all successive segments in precharges 24 (FIG. 3) and 26, have substantially identical threshold voltages and dimensions.

The ensuing development of FIG. 4 will consider the structures and combined operations attributed to segment 28 and column/ground select segment 29. FETs 71, 72, 73, 74 and 76 are enabled by line 77, and FETs 78, 79, 81, 82 and 83 are enabled by line 84, to charge the bit line nodes, such as 33, to a prechargeable level of 1.8 volts when both column selects, $C_0$ and $C_1$ are at the binary "0" level. The 1.8 volts represents a voltage on line VA less the threshold of FET 68. FET 86 is always conductive. If, on the other hand, either line $C_0$ or $C_1$ is at binary "1", one or the other of the series-connected FETs, such as 72 or 78, decouple node 33 from precharge segment 28. In this way, the NAND stacks need only discharge the capacitive charge on the bit nodes to lower the potential on node 33 in accordance with the data in the NAND stack. Note that the fundamental structure of the precharge segment 28 is replicated by column in memory array 10, whereas precharge driver circuit 27 is not.

As was noted earlier, the decode circuits which generate the signals on lines designated "C" from addresses $A_0$–$A_K$ have been omitted by virtue of their being widely known and utilized. In the context of the structure in FIG. 4, a column/ground select signal on line $C_0$ grounds virtual ground node 39 to select certain NAND stacks, and simultaneously grounds node 77 to disable the precharge operation. Note that a binary "1" signal on line $C_0$ also enables pass FETs 88, 49, 89, 91 and 92 to couple data from the bit nodes to the corresponding bit lines. For example, FET 49 couples the data represented by the state of node 33 to BIT LINE 0. BIT LINE 7, at the left in FIG. 4, is connected to only two NAND stacks, providing half the bit data, with the remaining two NAND stacks located 8 columns of memory array units (FIG. 3) to the right. As was true for precharge segment 28, the structure of column/ground select segment 29 is replicated once per column in progression by unit to the right.

With the description of the precharge and column/ground select circuits concluded, a brief reference back to FIG. 3 will disclose that composite ROM system 11 has been described for all blocks excepting reference cells 22, sense amps 21 and variable speed drivers 23. To fully consider the remaining blocks it should be recognized that the 8 lines bus 19 are commonly connected to corresponding bit lines in each of the 16 columns making up memory array 10. Consequently, only one column of units, the selected column, can be connected to bus 19 at any one time. Furthermore, all three blocks, 21, 22 and 23, contain 8 substantially identical circuits in numerical correspondence to the 8 lines of data furnished on bus 19.

Figure 7:
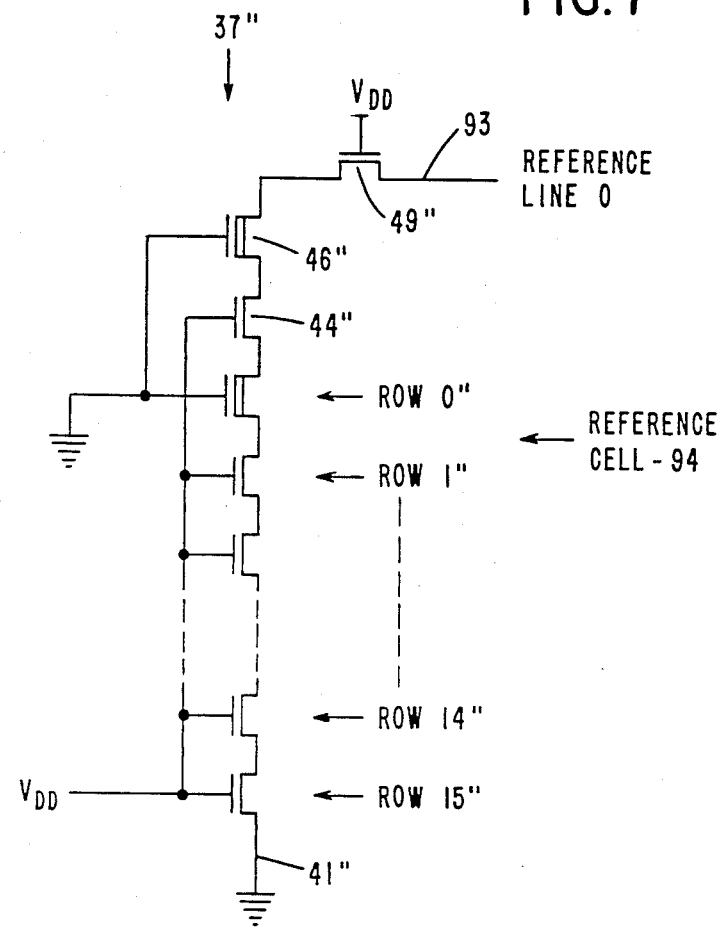
FIG. 7 is a schematic of the preferred reference cell circuit.

The first of the remaining blocks to be considered is reference cells 22. A preferred embodiment of a reference cell, 94, is shown in FIG. 7. The reference cell circuit generates a potential on reference line 93 which is substantially identical to the potential that would appear on BIT LINES 0–7 (FIG. 4) if the NAND condition in the selected stack were satisfied. To accomplish this, reference cell 94 structurally replicates a NAND stack, the bank select, and the column/ground select circuits, in terms of structural and electrical parameters. The similarity in structure and performance is further ensured by the fact that the devices in composite ROM system 11 (FIG. 3) are subjected to substantially identical fabrication environments by their location on a common IC chip.

Functional correspondence between elements in reference cell 94 of FIG. 7 and those in a NAND stack (FIG. 4) is indicated by the use of corresponding reference numerals modified by the addition of a double prime superscript. For example, depletion FET 46″ of stack 37″ in FIG. 7 corresponds functionally to depletion FET 46 of stack 37 in FIG. 4.

Figure 8:
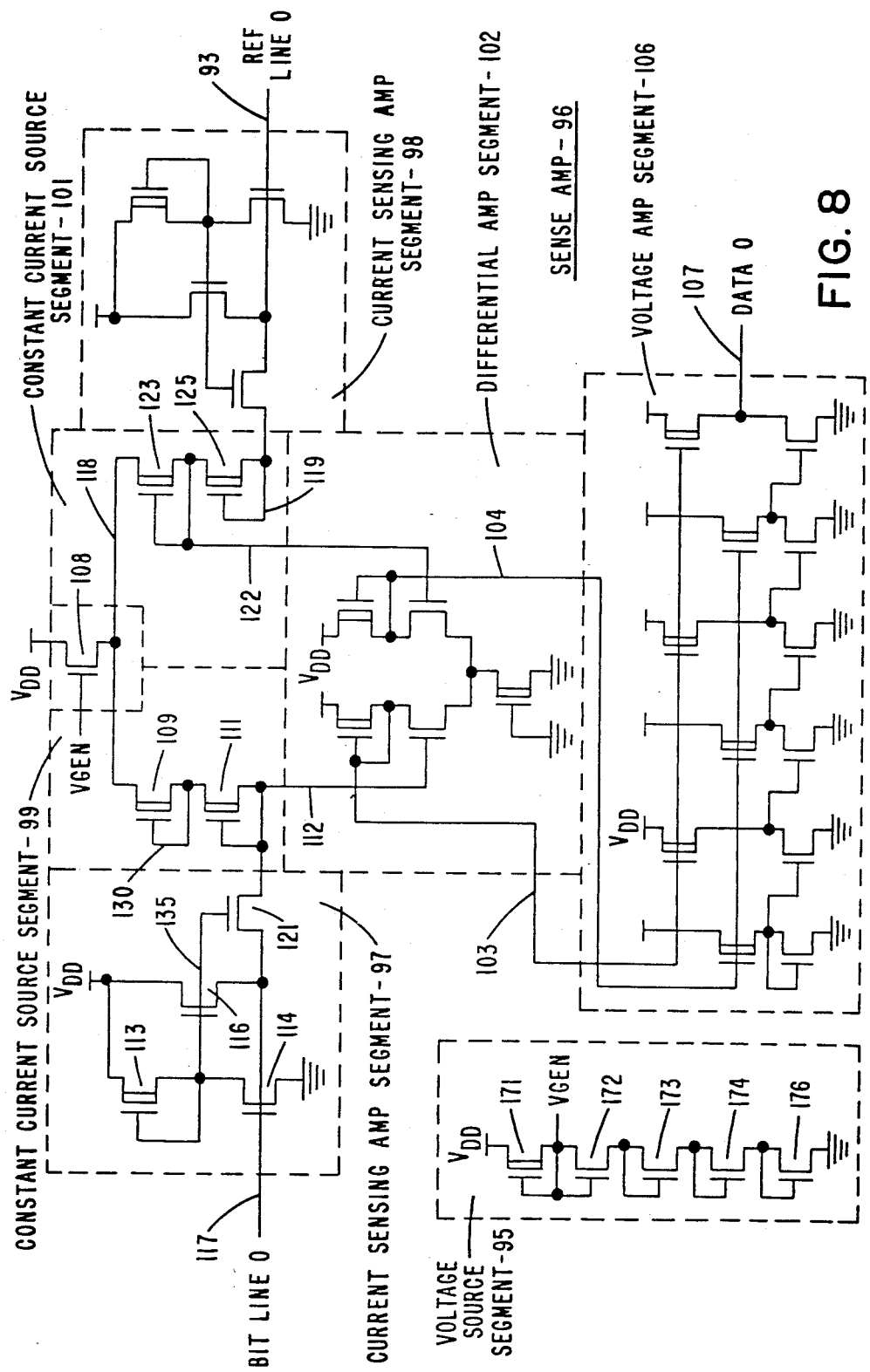
FIG. 8 is a schematic of the preferred sense amplifier circuit.

The ensuing development will provide a structural and functional description of a representative sense amp, 96, from block 21 in FIG. 3. Recall that sense amp 96, schematically depicted in FIG. 8, is but one of 8 substantially identical amps in block 21. Sense amp 96 compares the state on BIT LINE 0, from FIG. 4, to the reference state on REFERENCE LINE 0, from FIG. 7, to determine the bit content of the NAND stack selected for BIT LINE 0.

A cursory analysis of sense amp circuit 96 discloses that the current sensing amp segments, 97 and 98, voltage source segment 95, the constant current source segments, 99 and 101, and differential amp segment 102 are symmetrically disposed with respect to the differential sensing operation. Considering the symmetry, only one side need be described in particular detail.

The output signals from differential amp segment 102 on lines 103 and 104 transition in opposite directions. Voltage amplifier segment 106 receives signals on lines 103 and 104 from differential amp segment 102, removes the bias voltage, amplifies the difference, and provides an output on the DATA 0 line designated as 107. The signal levels on output line DATA 0 are 0 or $V_{DD}$ volts in magnitude, corresponding respectively to a binary "0" or binary "1". Each segment of sense amp 96 will be considered in turn.

FETs 171, 172, 173, 174 and 176 are configured to form voltage source segment 95 suitably stable to bias common FET 108 of constant current sources 99 and 101. The output from voltage source segment 95, on line VGEN, is substantially insensitive to fluctuations on power supply line $V_{DD}$. Thereby, the reference currents generated in segments 99 and 101 are also isolated from fluctuations of the $V_{DD}$ voltage. As embodied, a single voltage source segment, 95, is used to bias all 8 sense amps 96 in block 21 (FIG. 3), providing each with a nominal 3.8 volts on common line VGEN.

The stable voltage on line VGEN is used to form constant current sources 99 and 101. According to the embodiment, equivalent depletion FETs 109 and 111 provide approximately 3 microamps to node 112, while equivalent depletion FETs 123 and 125 provide approximately 3 microamps to node 119, when common node 118 is held at approximately 3.2 volts by the bias FET 108. FETs 109, 111, 123 and 125 are preferably formed from multiple FETs having dimensions similar or identical to those of ROM cell FETs 32 (FIG. 4). If the structural similarity exists, processing variations will affect constant current source segments 99 and 101 to the same extent as the ROM cell FETs. In the present embodiment, equivalent FETs 109 and 123 are formed from a series connection of five depletion FETs each, having all gate electrodes common to nodes 130 and 122, respectively. Equivalent FETs 111 and 125 are structurally formed from four series connected depletion FETs, having the gate electrodes common to nodes 112 and 119 respectively.

Current sensing amp segment 97 is comprised of FETs 113, 114, 116 and 121. FETs 113, 114 and 116 are selected and processed to be structurally and functionally identical to respective FETs 62, 63 and 64 in FIG. 4. This arrangement ensures that sense line 117 will be clamped by FETs 113, 114 and 116 to an upper limit of approximately 1.8 volts, the formerly specified precharge level. Thereby, at the time of addressing the precharge voltage on the bit nodes, such as 33 (FIG. 4) in memory array 10 (FIG. 3), is substantially identical to the precharge amplitude on sense line 117 in FIG. 8.

If bit node 33 in the arrangement of FIG. 4 is not subjected to a discharge through a NAND stack, the voltage balance between bit node 33 and sense line 117 in FIG. 8 ensures that node 112 remains higher in voltage than node 122 on the reference side. On the other hand, if node 33 undergoes a discharge, the net difference in potential will cause a current to flow from node 112 to node 33 over BIT LINE 0. In the latter situation, the sinking of current from constant current source segment 99 will lower the potential of node 112 below that present on node 122, connected to the opposite side of differential amp segment 104.

To achieve the performance described above, FET 121 is fabricated to have a lower threshold voltage than FET 116, and the gate electrodes of both FETs are connected to node 135. With these relationships in effect, when line 117 is pulled downward in potential, e.g. by a conductive path through a selected NAND stack, FET 121 is the first to be enabled. When FET 121 turns on, node 112 is coupled to line 117. The two operational voltage extremes for node 112 in the present embodiment are in the range of 1.8 volts and 3 volts.

Careful observation will disclose that constant current source segments 99 and 101 do differ in one respect. Whereas node 112 from differential amp segment 102 is connected to lower equivalent FET 111, corresponding node 122 from differential amp segment 102 is connected to upper equivalent FET 123. This arrangement introduces a fixed offset of approximately 2.5 volts on node 122, establishing a threshold for one side of differential amp 102 substantially midway between the extremes of the voltage excursions provided to the other side.

Voltage amp segment 106 amplifies the differential output voltage from differential amplifier segment 102, removes the non-zero level, and provides a buffered output on DATA 0 line 107. The arrangement and operation of the FETs in segment 106 are relatively conventional, and consequently warrant no further description.

Upon reconsidering the various elements comprising composite ROM system 11 as depicted in FIG. 3, it is recognized that variable speed driver block 23 remains to be developed. As was true of sense amps block 21, there are 8 individual drivers in block 23, corresponding in count to the number of data lines.

To gain some appreciation for the numerous unique design features which characterize the structure and operation of the circuits forming variable speed driver 23, it should first be recognized that the fundamental access and switching times for composite ROM system 11 are relatively short. Unfortunately, rapid transitions in the rise and fall rates of the signals on the data output lines are not always beneficial or compatible with intended applications. Moreover, it is also not efficient to develop different circuit designs to compensate for varying interface limitations.

Figure 9:
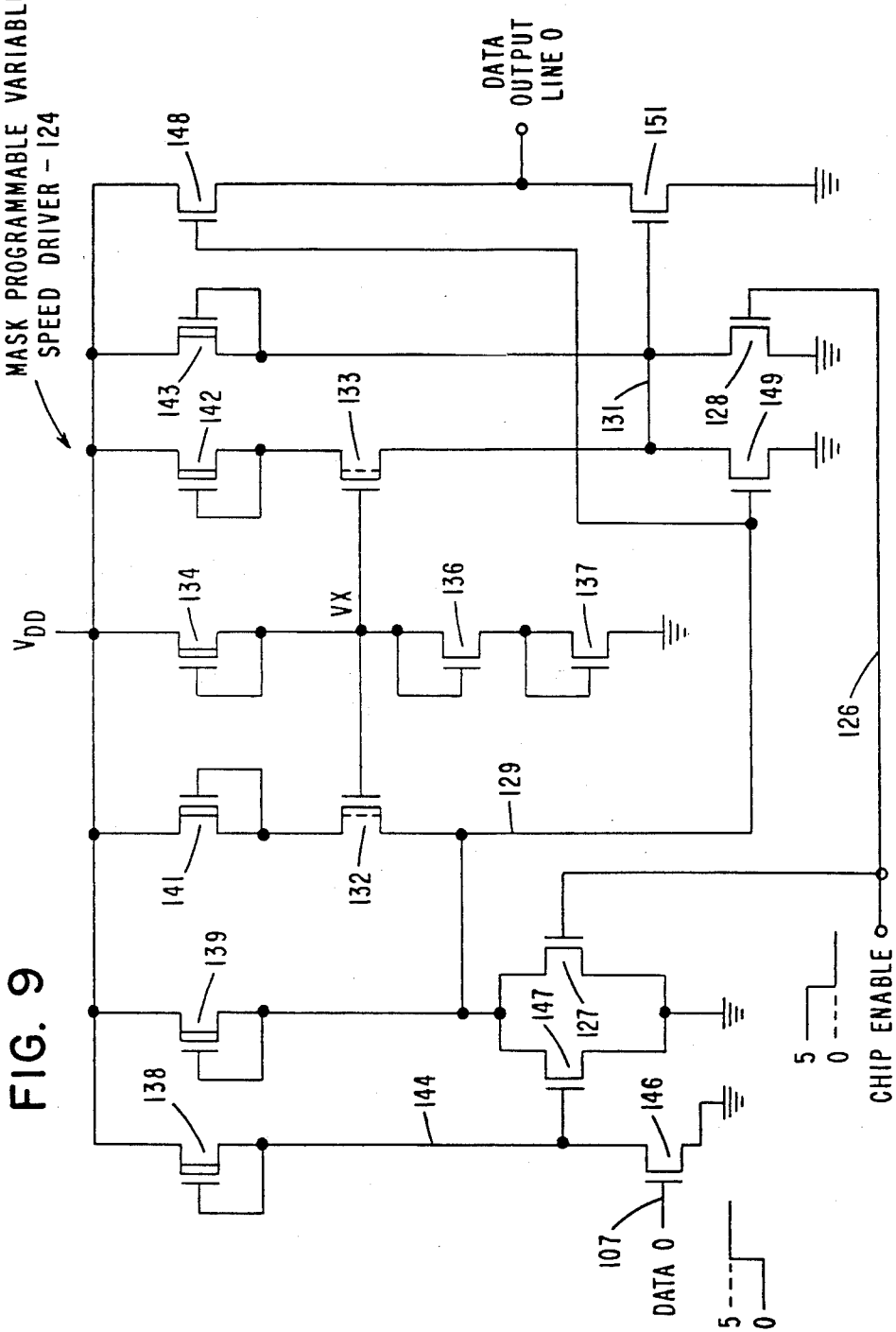
FIG. 9 is a schematic of the preferred mask programmable variable speed driver circuit.

To overcome these diverging constraints, composite ROM system 11 provides for an adjustment in both the rise and fall time of the output voltage over a nominal 3:1 range by using mask programmable variable speed driver circuit 124, shown in FIG. 9 of the drawings. According to the present embodiment, circuit speed is programmed during the depletion implant operation, by an appropriate pattern in the ROM mask, to change the operating mode of two FETs in driver 124. Thereby, the ROM data and driver speed are entered simultaneously.

FIG. 9 illustrates an embodiment of mask programmable variable speed driver 124. The input signal to driver 124 appears on the DATA 0 line, designated 107, from sense amp 96 (FIG. 8), while the output signal is furnished on DATA OUTPUT LINE 0. The chip enable signal, shown coupled to line 126 is utilized in composite ROM system 11 to implement a tri-state disable mode, as perceived on DATA OUTPUT LINE 0, by using FETs 127 and 128 to ground respective nodes 129 and 131 when disabled.

The programming of the transition rate is performed at the time of the depletion implant by either exposing or masking FETs 132 and 133. This is schematically represented in FIG. 9 by the use of dashed lines at locations normally indicating a depletion type device. If the FETs are subjected to the depletion implant, the transition rate remains high. On the other hand, if FETs 132 and 133 remain enhancement mode devices, the output voltage rise and fall rates are reduced by a factor of approximately 3. To understand the implementation, reference is made to the circuit in FIG. 9 and the generalized output waveforms presented in FIGS. 10, 11, 12 and 13 for a step input signal on line 107.

Note that the gate electrodes of FETs 132 and 133 are coupled to node VX, which is itself located in a series arranged voltage divider formed by FETs 134, 136 and 137. According to the divider, the voltage on node VX is approximately equal to two FET thresholds, about 1.2 volts. Therefore, one may conclude that FETs 132 and 133 will be cut off when respective source nodes 129 and 131 reach 0.6 volts if they are enhancement mode devices, or will never be cut off if they have been subjected to a depletion implant. The other depletion FETs in the circuit, 138, 139, 141, 142 and 143, are arranged in conventional manner as load elements.

As a first operational arrangement, consider a situation where FETs 132 and 133 have not been subjected to a depletion implant during fabrication, thereby remaining as enhancement mode devices. The rise and fall waveforms in FIGS. 10 and 11 correspond. A rise in the signal on line 107 from 0 to 5 volts is inverted at node 144 by the action of FETs 138 and 146. With a fall in the voltage on node 144, FET 147 cuts off and initiates a charging of capacitive node 129 via FETs 139, 141 and 142. Note, however, that at time $t_1$ FET 132 also cuts off, limiting the charge rate of node 129 to the lesser current provided through small FET 139. FET 148, on the output side, follows the rate of rise of the voltage on capacitive node 129. FIG. 10 shows the representative rise time to be in the range of 30 nanoseconds.

A similar sequence occurs as to the fall time, plotted for DATA OUTPUT LINE 0 in FIG. 11. In this case, however, it is the effect on capacitive node 131 of FET 149 turning off, followed at time $t_1$ with FET 133, acting on output FET 151.

If FETs 132 and 133 are subjected to the depletion implant at the time of ROM programming, neither reaches a cutoff condition. Consequently, capacitive nodes 129 and 131 increase to voltage $V_{DD}$ at the maximum rate to drive, the output signal with a rise or fall time of approximately 10 nanoseconds. Plots of the latter signals appear in FIGS. 12 and 13.

In considering the whole of composite ROM system 11 as shown in FIG. 3 of the drawings, it will undoubtedly be recognized that the X-AND-OR configuration schematically depicted in FIG. 4 can be modified in various manners to satisfy the particular objectives sought without departing from the fundamental teachings of the invention. For instance, if access speed is of paramount importance, one should evaluate the merits of the modifications shown in FIG. 14. According to the circuit in FIG. 14, the composite ROM system has been altered by the addition of supplemental precharge segment 152 in close physical proximity to column/ground select segment 29. The supplemental circuit ensures the rapid precharge of capacitive virtual ground nodes 39 and 41 when the addressing signals select adjacent columns, such as $C_0$ and $C_1$ or $C_1$ and $C_0$, in direct succession. Were it not for the supplemental precharge, the extended character of virtual ground nodes 39 and 41 would introduce a delay associated with precharging from the top of each column of memory array units 12 (FIG. 3).

Figure 14:
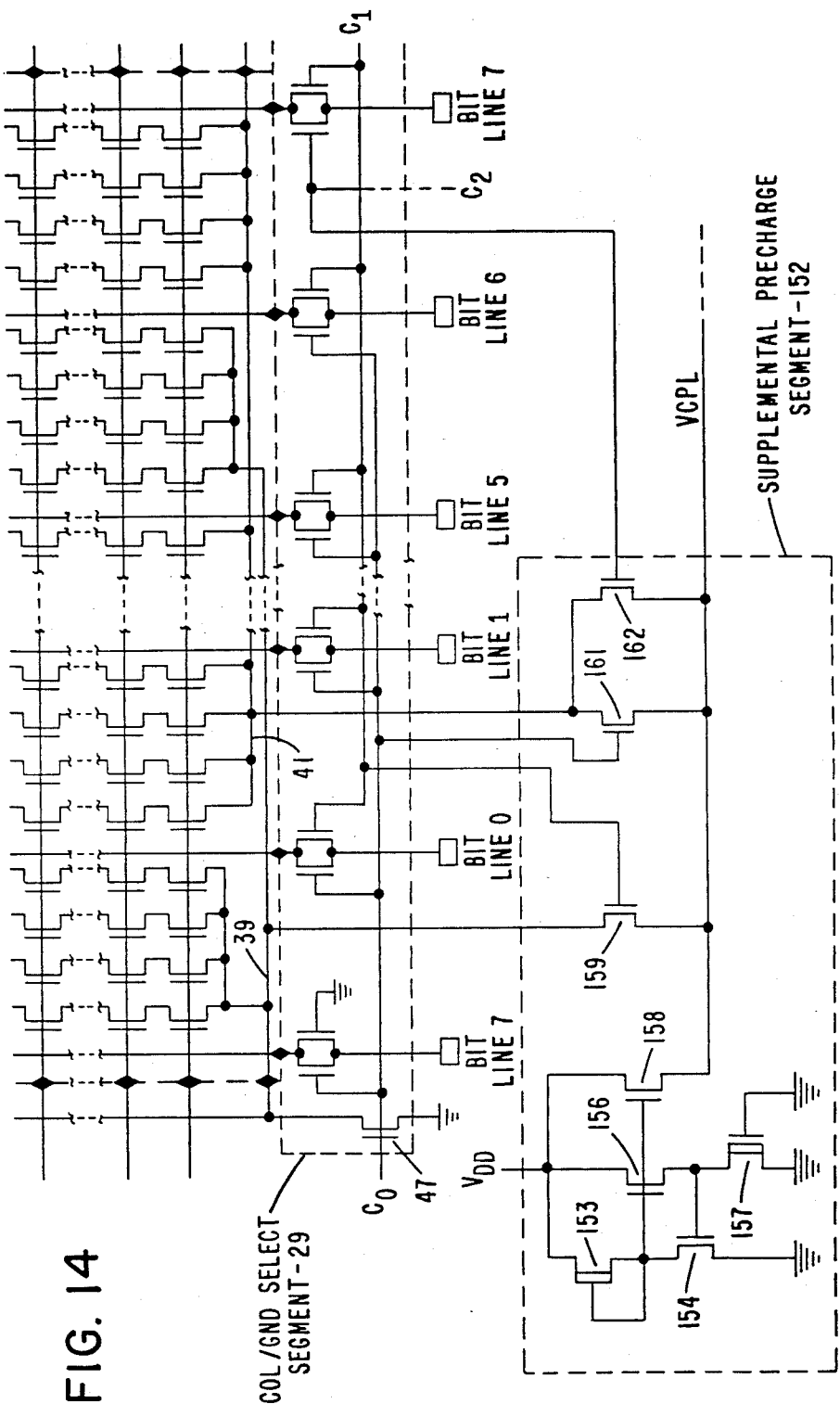
FIG. 14 is a schematic of an alternate embodiment for the circuit in FIG. 4.

The similarities between supplemental precharge segment 152 and precharge segment 28 (FIG. 4) can be visibly perceived by comparing the arrangement of FETs 153, 154, 156, 157, 158, 159 and 161 in FIG. 14 with correspondingly situated FETs 62, 63, 64, 66, 67 or 69, 163 and 94 in FIG. 4. FET 162, driven by column/ground select line $C_2$ ensures that virtual ground node 41, associated with line $C_1$, is appropriately precharged after either a $C_0$ or $C_2$ select cycle. Again, precharge line VCPL is fixed to a nominal potential of 1.8 volts.

The preference for adding supplemental precharge segment 152 in FIG. 14 over increasing the current conducting capacity of precharge segment 28 in FIG. 4 is influenced significantly by the current sinking capacity of the virtual ground selection FETs, such as FET 47 in FIG. 4. If precharge segment 28 were to be increased in current conducting capacity, the size of the FETs, such as 47, and all related conductive interconnects, would have to be increased. This form of modification, however, further increases the capacitance of the nodes, such as 39, in each column of memory array units 12 (FIG. 3). In contrast, supplemental precharge segment 152 in FIG. 14 provides precharging to the virtual ground modes without altering the remaining circuit.

Figure 15:
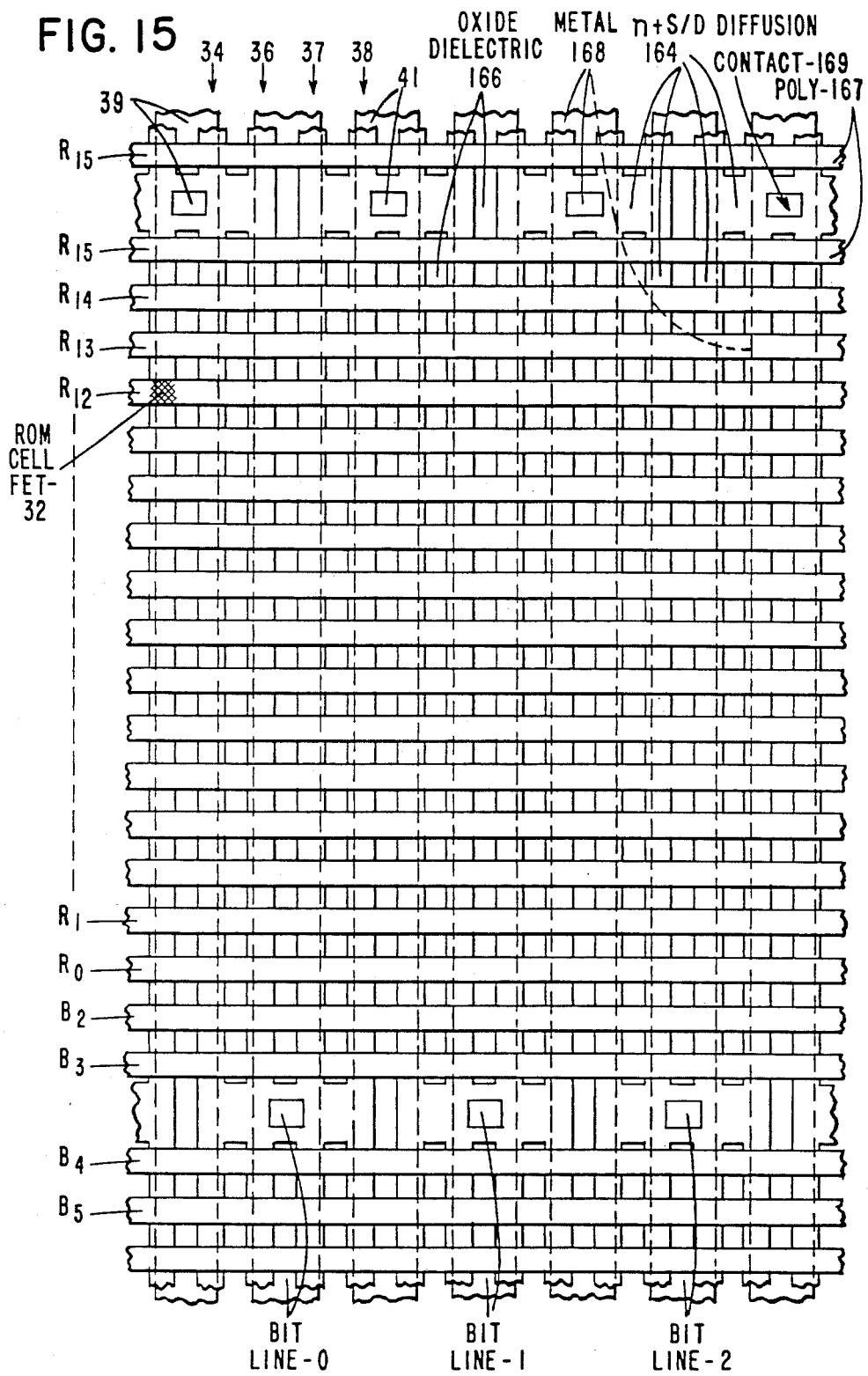
FIG. 15 is a schematic of preferred masking patterns suitable to fabricate the NAND stacks of the memory array.

FIG. 15 schematically depicts the masking patterns used to fabricate a section of memory array 10 (FIG. 3) as an integrated circuit. A comparison of the circuit representation in FIG. 4 with the physical implementation in FIG. 15 provides some appreciation for the high density obtainable with the X-AND-OR array arrangement. As embodied in FIG. 15, n+ source/drain (S/D) diffused areas 164 and electrically isolating oxide areas 166 project vertically in the figure. The poly gate electrode areas, 167, which form the row and bit lines of the first conductive layer project horizontally. The metal bit and virtual ground line areas, 168, which are formed in the second conductive layer of the IC, also project vertically in the figure. Interconnects, such as the one at 169, form the conductive vias between the S/D diffusions and the metal second conductive layer lines. The cross-hatched area signifies the relative location of a representative ROM cell FET, 32 (FIG. 4). It is no doubt understood that a ROM cell FET exists at each intersection of poly row areas 167 with diffused areas 164. Note that the lesser frequency of the vertically oriented metal line areas, 168, when compared to the vertical S/D diffused areas, 164, is offset by their inherently greater size, to provide an unusually efficient utilization of chip space.

Referring back to FIG. 3, one no doubt now appreciates the individual unique features which characterize the invention and their merger into a composite ROM system. Accordingly, one skilled in the art will recognize that the various circuits by which the invention has been described are amenable to various changes and reapplications. For this reason, it should be understood that each claim must be accorded an individual breadth coextensive not only with the scope of the embodiment but with the full spirit of the invention features individually and in the combination.

We claim:

1. A sensing amplifier responsive to the difference in current sinking capacity between an input line and a reference line, comprising:

means for generating a first constant current to a first reference node;

means for generating a second constant current to a second reference node;

a first pass FET conductively connected between said input line and said first reference node, and having its gate electrode biased in inverse proportion to the potential on said input line;

a second pass FET conductively connected between said reference line and said second reference node, and having its gate electrode biased in inverse proportion to the potential on said reference line; and means for detecting a difference in the current sinking capacity between said input line and said reference line.

2. The sensing amp recited in claim 1, further comprising:

means for precharging said input line and said reference line.

3. The sensing amp recited in claim 2, wherein:

said means for detecting a difference in the current sinking capacity is a differential amplifier responsive to a difference between said first reference node potential and said second reference node potential; and the nominal potential on said first reference node is offset by a fixed difference from the nominal potential on said second reference node.

* * * * *